(12) United States Patent
Obweger et al.

(10) Patent No.: US 8,573,236 B2
(45) Date of Patent: Nov. 5, 2013

(54) APPARATUS AND METHOD FOR ULTRASONIC WET TREATMENT OF PLATE-LIKE ARTICLES

(75) Inventors: Rainer Obweger, Lind Im Drautal (AT); Alexander Lippert, Villach (AT); Harry Sax, Villach (AT)

(73) Assignee: Lam Research AG, Villach (AT)

( * ) Notice: Subject to any disclaimer, the term of this patent is extended or adjusted under 35 U.S.C. 154(b) by 694 days.

(21) Appl. No.: 12/600,351

(22) PCT Filed: Apr. 24, 2008

(86) PCT No.: PCT/EP2008/054974
§ 371 (c)(1),
(2), (4) Date: Nov. 16, 2009

(87) PCT Pub. No.: WO2008/138725
PCT Pub. Date: Nov. 20, 2008

(65) Prior Publication Data
US 2010/0147336 A1    Jun. 17, 2010

(30) Foreign Application Priority Data

May 16, 2007 (AT) .................................. A 772/2007

(51) Int. Cl.
*B08B 3/12* (2006.01)
(52) U.S. Cl.
USPC ................ 134/184; 134/44; 134/61; 134/63; 134/902
(58) Field of Classification Search
USPC ................ 134/1.2, 1.3, 44, 61, 63, 184, 902
See application file for complete search history.

(56) References Cited

U.S. PATENT DOCUMENTS

| | | | | |
|---|---|---|---|---|
| 3,765,768 A | * | 10/1973 | Budin et al. | 356/28 |
| 4,698,775 A | * | 10/1987 | Koch et al. | 700/218 |
| 5,025,666 A | * | 6/1991 | Kobayashi et al. | 73/632 |
| 5,401,529 A | * | 3/1995 | Wollam | 427/8 |
| 5,444,637 A | * | 8/1995 | Smesny et al. | 702/127 |

(Continued)

FOREIGN PATENT DOCUMENTS

| | | |
|---|---|---|
| JP | 7-111255 | 4/1995 |
| JP | 1998303161 A | 11/1998 |

(Continued)

OTHER PUBLICATIONS

International Search Report dated Jul. 21, 2009, from corresponding PCT application, PCT/EP2008/054974.

(Continued)

*Primary Examiner* — Michael Barr
*Assistant Examiner* — Benjamin L Osterhout
(74) *Attorney, Agent, or Firm* — Young & Thompson

(57) ABSTRACT

Disclosed is a method and a respective apparatus for ultrasonic wet treatment of a plate-like article, which comprises: bringing a solid element, which is connected to a transducer in close proximity to a surface of a plate-like article so that a gap is formed between the solid element and the plate-like article, the gap having a distance d2 between 0.1 mm and 5 mm, dispensing liquid for filling the gap between the solid element and the plate-like article, and detecting ultrasonic waves and/or controlling the distance d2, by measuring the distance d2, comparing the measured distance with a desired distance d0 and adjusting the distance accordingly.

20 Claims, 5 Drawing Sheets

(56) References Cited

U.S. PATENT DOCUMENTS

Figure 1:
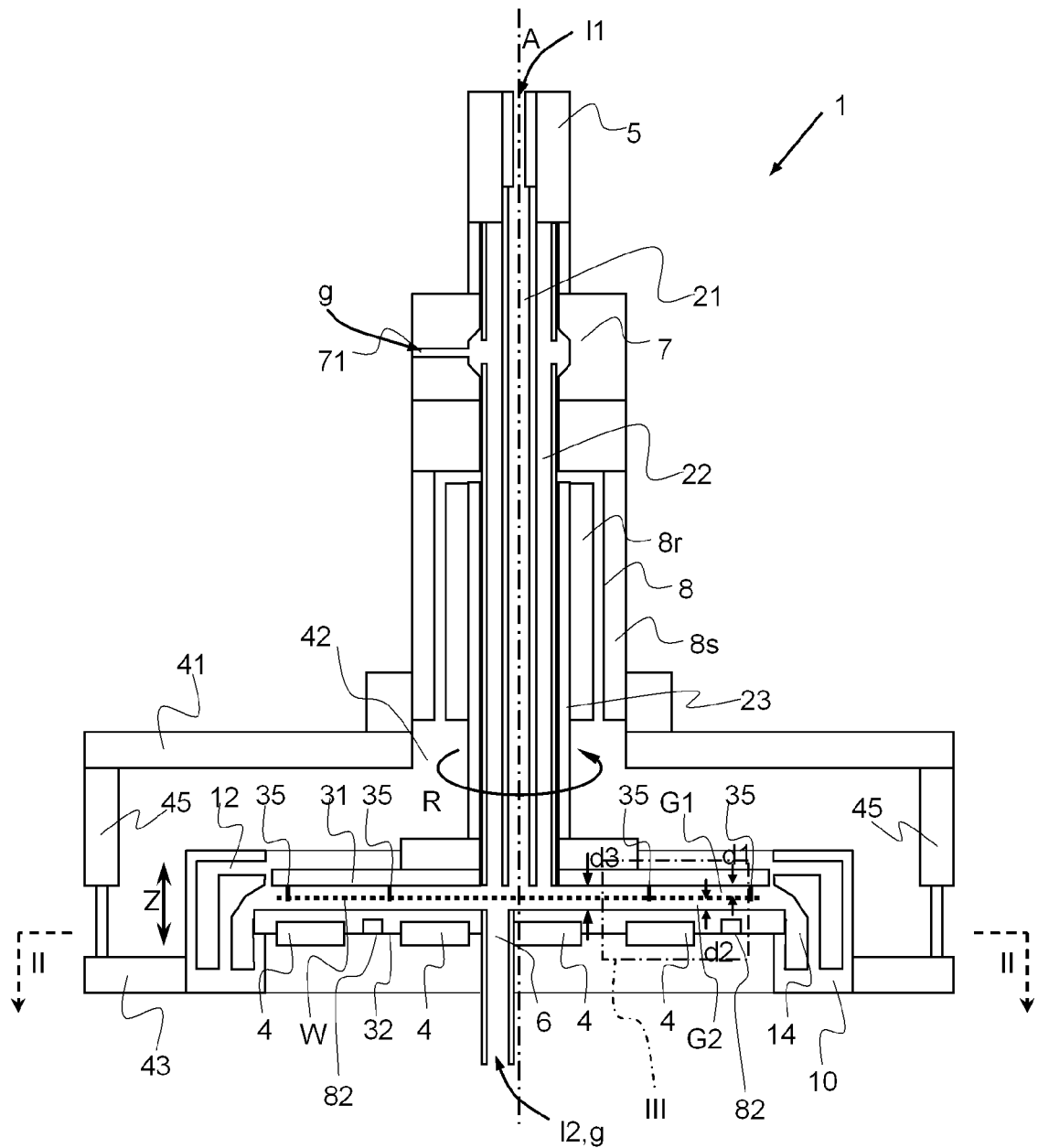

| | | | |
|---|---|---|---|
| 5,787,595 A * | 8/1998 | Desai et al. | 30/531 |
| 6,228,563 B1 * | 5/2001 | Starov et al. | 430/327 |
| 6,333,268 B1 * | 12/2001 | Starov et al. | 438/691 |
| 6,431,184 B1 * | 8/2002 | Taniyama | 134/1.3 |
| 2002/0062840 A1 * | 5/2002 | Verhaverbeke et al. | 134/1.3 |
| 2004/0025911 A1 * | 2/2004 | Yeo et al. | 134/113 |
| 2004/0132318 A1 | 7/2004 | Kim et al. | |
| 2004/0231697 A1 * | 11/2004 | Azar | 134/1 |
| 2006/0174919 A1 * | 8/2006 | Randhawa | 134/34 |
| 2009/0071503 A1 | 3/2009 | Branz et al. | |

FOREIGN PATENT DOCUMENTS

| | | |
|---|---|---|
| JP | 2003340386 A | 12/2003 |
| JP | 2005026668 A | 1/2005 |
| JP | 2005347761 A | 12/2005 |
| WO | 2004/114372 | 12/2004 |
| WO | 2006048185 A1 | 5/2006 |

OTHER PUBLICATIONS

Japanese Notice of Reason for Rejection dated Jun. 5, 2012, from corresponding JP application.

* cited by examiner

APPARATUS AND METHOD FOR ULTRASONIC WET TREATMENT OF PLATE-LIKE ARTICLES

TECHNICAL FIELD

The invention relates to an apparatus and a method for ultrasonic wet treatment of a single plate-like article, comprising:

- a solid element connected to a transducer for treating the plate-like article with ultrasonic energy, wherein a gap is formed between the solid element and the plate-like article, the gap having a distance d2 between 0.1 mm and 15 mm,
- liquid dispensing means for introducing liquid into the gap between the solid element and the plate-like article.

If the distance of the solid element to the plate-like article is in the range of the wave-length $\lambda$ (i.e. $d2 \leq 10*\lambda$) or below it is referred to as near-field ultrasonic.

The apparatus for wet treatment of plate-like articles may comprise a plate as the solid element, holding means for holding a single plate-like article substantially parallel to the plate, and dispensing means for introducing liquid into a first gap between said first plate and a plate-like article when being treated. Such plate as the solid element can cover the whole plate-like article or only a part thereof. If only a part of the plate-like article is covered the plate-shaped solid element can be pie shaped.

However, such a solid element may also be an elongated probe (i.e. rod or shaft), to which ultrasonic transducers are connected.

If in the following the term wafer is used such plate-like articles are meant.

Such plate-like articles can be disc-like articles such as semiconductor wafers, or compact discs as well as polygonal articles such as flat panel displays or reticles.

Whenever herein the term ultrasonic is used it shall be understood that megasonic is included herein as being a specific form of ultrasonic i.e. above 1 MHz.

BACKGROUND ART

WO20041114372A1 discloses a megasonic cleaner wherein the plate-like article is held between two plates (one plate holds ultrasonic transducers), the plate-like article and the transducer plate are rotated against each other.

Although this system brings very good cleaning results sometimes damages to the semiconductor devices and structures on the wafer occur.

Therefore it is an object of the invention to provide an apparatus and a method, which can be better monitored and if necessary even controlled in order to improve the treatment results.

DISCLOSURE OF INVENTION

The invention meets the objects by providing an apparatus for ultrasonic wet treatment of a plate-like article, comprising:

- a solid element connected to a transducer for treating the plate-like article with ultrasonic energy wherein a gap is formed between the solid element and the plate-like article, the gap having a distance d2 between 0.1 mm and 15 mm
- liquid dispensing means for introducing liquid into the gap between the solid element and the plate-like article when being treated
- means for controlling the distance d2, the means for controlling the distance comprising means for measuring the distance d2, means for comparing the measured distance with a desired distance d0 and distance adjusting means for adjusting the distance accordingly.

The solid element is connected to the transducer for treating the plate-like article with ultrasonic energy so that ultrasonic energy is transmitted by the solid element towards the plate-like article through a treatment liquid. Such connection can be sintering or gluing solid element and transducers together or the transducer is coupled to the solid element by a coupling liquid.

Such liquid dispensing means can be selected from different embodiments. If the solid element is a plate substantially parallel to the plate-like article a liquid pipe with an opening close to the centre of the plate-like article. Close to the centre in this respect means that the centre of the opening is not more than 20 mm apart from the centre of the plate-like article.

If the solid element is a rod or does not fully cover the plate-like article liquid can be dispense to the plate-like article in a free-flow manner.

If the solid element and the plate-like article are immersed in a tank the liquid dispensing means are feed pipes for feeding liquid into the tank. Consequently the gap between the solid element and the plate-like article is filled.

The desired distance d0 typically would be a distance to a plate-like article, at which particle-removal-efficiency (PRE) is at the highest possible level and at the same time low damages (e.g. breaking a electrical line/connection) or better no damages occur. Such desired distance d0 might be $\lambda/2$, $\lambda$, $\lambda/4$, or $3\lambda/4$. However, d0 depends on many different parameters, such as material of plate-like article, surface behaviour of plate-like article, impedance of solid element, kind of transducer. Therefore d0 is typically empirically determined for a given apparatus configuration and a given plate-like article.

Furthermore depending on the system and on the desired process results and depending on the plate-like article a desired maximum deviation ($\Delta d = d2 - d0$) is determined. For controlling the distance d2 the actual distance is measured, $\Delta d$ is calculated and if the deviation is higher than desired the distance is changed with the distance adjusting means until the distance is within the desired range. This controlling loop is typically carried out by a computer or a controller, which is well known. The controlling means (e.g. computer) receives the measured distance signals, and calculates the needed distance adjusting signals.

With such an apparatus a plate-like article such as semiconductor wafers can be treated (e.g. cleaned) using a process which is optimized and permanently or periodically monitored and can be adjusted if necessary.

The distance adjusting means may comprise a linear motor, a spindle driven by an electric motor (e.g. stepper motor, servo motor), a hydraulic motor a pneumatic motor, hydraulic cylinder pneumatic cylinder and/or piezo-electric motors or drives.

If parallelism between the plate-like article and a plate-like solid element or a rod-like solid element is sufficient there is only one distance adjusting means necessary.

If parallelism is not sufficient and shall thus be corrected— so that the distance is within the desired deviation—more than one distance adjusting means are advantageous. If the solid element is a plate distance measuring means advantageously comprise elements so that the distance between the plate-like article and the solid element can be measured on at least three different measuring points. Preferably one distance adjusting means corresponds to each measuring point.

Alternatively one distance adjusting means is provided and two angle adjusting means are provided. Each angle adjusting means may tilt the plate about a tilting axis, wherein each tilting axis is not perpendicular to the plate, and wherein the two tilting axis are not parallel to each other.

If the solid element is a rod-like or elongated element distance measuring advantageously comprises elements so that the distance between the plate-like article and the solid element can be measured on at least two different measuring points. Consequently at least two adjusting means are preferred, of which at least one is a distance adjusting means. The other adjusting means is a distance adjusting means or an angle adjusting means.

In one embodiment of the apparatus the means for measuring the distance $d2$ comprise optical distance measuring elements. Such optical distance measuring elements may comprise laser distance measuring elements. In this case light may be emitted from an element, which is attached to the surface of the solid element facing the plate-like article, reflected by the plate-like article and detected by another element attached to the surface. Preferably the emitting as well as the detecting elements are not disturbing the smoothness of the surface of the solid element facing the plate-like article; in other words neither the emitting nor the detecting elements shall project or reject from the surface plane more than 0.2 mm.

Preferably the means for measuring the distance $d2$ comprise ultrasonic measuring elements comprising an ultrasonic transducer for sending the distance measuring signal (e.g. half wave, wave, sinus or rectangle shape or a pulsed signal) and an ultrasonic detector for detecting the distance measuring signal.

The ultrasonic transducer for sending the distance measuring signal can be simultaneously used for detecting the distance measuring signal. The ultrasonic transducer for treating the plate-like article with ultrasonic energy (treating transducer) can be simultaneously used for sending and/or for detecting the distance measuring signal. If the treating transducer is used for sending the pulsed signal the ultrasonic treatment frequency must be overlapped by a pulsed signal. If the treating transducer is used for detecting the distance measuring signal the detected signal received from treatment transducer has to be split in order to filter the detecting signal.

In one embodiment the ultrasonic transducer for measuring the distance is not the same transducer as for wet treatment of the plate-like article.

In another embodiment the ultrasonic detector for measuring the distance is simultaneously the ultrasonic transducer for sending the distance measuring signal.

If at least three ultrasonic transducers for measuring the distance are provided not only the distance can be detected but also the parallelism of the plate-like article versus a plate-like solid element can be monitored.

Another aspect of the invention is a method for ultrasonic wet treatment of a plate-like article comprising:
  bringing a solid element, which is connected to a transducer in close proximity to a surface of a plate-like article so that a gap is formed between the solid element and the plate-like article, the gap having a distance $d2$ between 0.1 mm and 15 mm, wherein this gap is filled with a liquid, and
  controlling the distance $d2$, by measuring the distance $d2$, comparing the measured distance with a desired distance $d0$ and adjusting the distance accordingly.

The gap can be filled by dispensing liquid for filling the gap between the solid element and the plate-like article. Alternatively the gap results when the plate-like article is immersed into a tank.

In one embodiment of the method the means for measuring the distance $d2$ comprise optical measuring elements. Alternatively distance measuring can be carried out with capacitive or inductive measuring means. If distance measuring is carried out before process starts even a mechanical measuring can be used.

Preferably the means for measuring the distance $d2$ comprise ultrasonic measuring elements comprising an ultrasonic transducer for sending the distance measuring signal and an ultrasonic detector for detecting the distance measuring signal.

In this method the ultrasonic transducer for measuring the distance is simultaneously the transducer for wet treatment of the plate-like article. Alternatively the ultrasonic transducer for measuring the distance is not the same transducer as for wet treatment of the plate-like article.

The ultrasonic detector for measuring the distance simultaneously can be the ultrasonic transducer for sending the distance measuring signal and/or the transducer for wet treatment of the plate-like article.

At least three ultrasonic transducers for measuring the distance can be provided, which is useful if a plate is used as the solid element for providing the ultrasonic energy with which the plate-like article shall be treated.

In a preferred embodiment of the method the means for controlling the distance further comprise a controller (e.g. computer) for automatically adjusting the distance $d2$.

In yet another aspect of the invention the apparatus for ultrasonic wet treatment of a plate-like article comprises:
  a solid element connected to a transducer for treating the plate-like article with ultrasonic energy, wherein a gap is formed between the solid element and the plate-like article, the gap having a distance $d2$ between 0.1 mm and 15 mm
  liquid dispensing means for introducing liquid into the gap between the solid element and the plate-like article when being treated
  means for measuring ultrasonic waves comprising an ultrasonic detector.

The ultrasonic detector can be selected from piezoelectric transducers, or hydrophones.

The means for measuring the ultrasonic waves can be elements for distance measuring and/or ultrasonic imaging systems.

The ultrasonic detector may simultaneously be the transducer for ultrasonic wet treatment of the plate-like article or may not be the same transducer as for wet treatment of the plate-like article.

In a preferred embodiment the ultrasonic detector is part of an ultrasonic power monitoring system, for monitoring ultrasonic waves, which have been coupled into the cleaning liquid by the cleaning transducers. For such monitoring it is not necessary to have a specific ultrasonic signal (e.g. pulsed signal) applied to the cleaning liquid. The power monitoring system simply detects and monitors ultrasonic, waves which have been reflected and deflected by the system. The monitoring can be done by a controller (e.g. computer), which for instance may automatically adjust a parameter (e.g. distance $d2$ or ultrasonic generator parameters). The controller can thus adjust the distance $d2$, even without having measured the actual distance $d2$, just by comparing the monitored signal with a desired signal.

If the transducer for ultrasonic wet treatment is simultaneously used for detecting a signal the detected signal should be electronically filtered.

In one embodiment an ultrasonic detector is part of an ultrasonic imaging system. Such image can be used for full monitoring the treatment conditions during the treatment of the plate-like article and/or for checking the status of the transducer assembly and whether it is properly coupled to the solid element.

Another aspect of the invention is a method for ultrasonic wet treatment of a plate-like article comprising:
  bringing a solid element, which is connected to a transducer in close proximity to a surface of a plate-like article so that a gap is formed between the solid element and the plate-like article, the gap having a distance d2 between 0.1 mm and 15 mm, wherein this gap is filled with a liquid, and
  detecting ultrasonic waves.

The gap can be filled by dispensing liquid for filling the gap between the solid element and the plate-like article. Alternatively the gap is filled when the plate-like article is immersed into a tank.

In such a method for ultrasonic wet treatment the detecting ultrasonic waves is carried out prior to ultrasonic wet treatment. This can be carried out without liquid in the gap, with a specific test-liquid in the gap and/or with the actual treatment liquid in the gap.

Such testing step, when carried out prior to the actual treatment step can be carried out at a lower power.

According to one embodiment of the method for ultrasonic wet treatment the detecting of ultrasonic waves is carried out prior to ultrasonic wet treatment when the gap between the solid element and the plate-like article is not filled with liquid. This is primarily done for testing the equipment (the function of the transducers as well as the proper coupling to the solid element). Therefore defects of the equipment can be detected before the equipment damages the plate-like article to be treated or before the equipment loses its ability to actual treat (e.g. clean) the plate-like article.

Advantageously the method for ultrasonic wet treatment is provided wherein the detection of ultrasonic waves is carried out simultaneously with the ultrasonic wet treatment when the gap between the solid element and the plate-like article is filled with liquid. This is merely for process controlling and process monitoring. Thereby ultrasonic waves which are used for ultrasonic treatment of the plate-like article are detected and/or additionally emitted pulsed or non-pulsed signals are detected.

Preferably the detection of ultrasonic waves is used for monitoring ultrasonic power i.e. the power of the ultrasonic waves, which have been coupled into the cleaning liquid by the cleaning transducers. For such monitoring it is not necessary to have a specific ultrasonic signal (e.g. pulsed signal) applied to the cleaning liquid. Simply ultrasonic waves are detected and monitored, which have been emitted by the cleaning transducers and then reflected and/or deflected by the system. Depending on the monitored ultrasonic power parameters of the cleaning process can be adjusted manually and/or automatically.

Advantageously the distance d2 is changed until the monitored ultrasonic power becomes as low as possible. Therefore PRE can be maximised, without increasing the power of the ultrasonic generated, which feeds the cleaning transducers.

BRIEF DESCRIPTION OF FIGURES IN THE DRAWINGS

Figure 2:
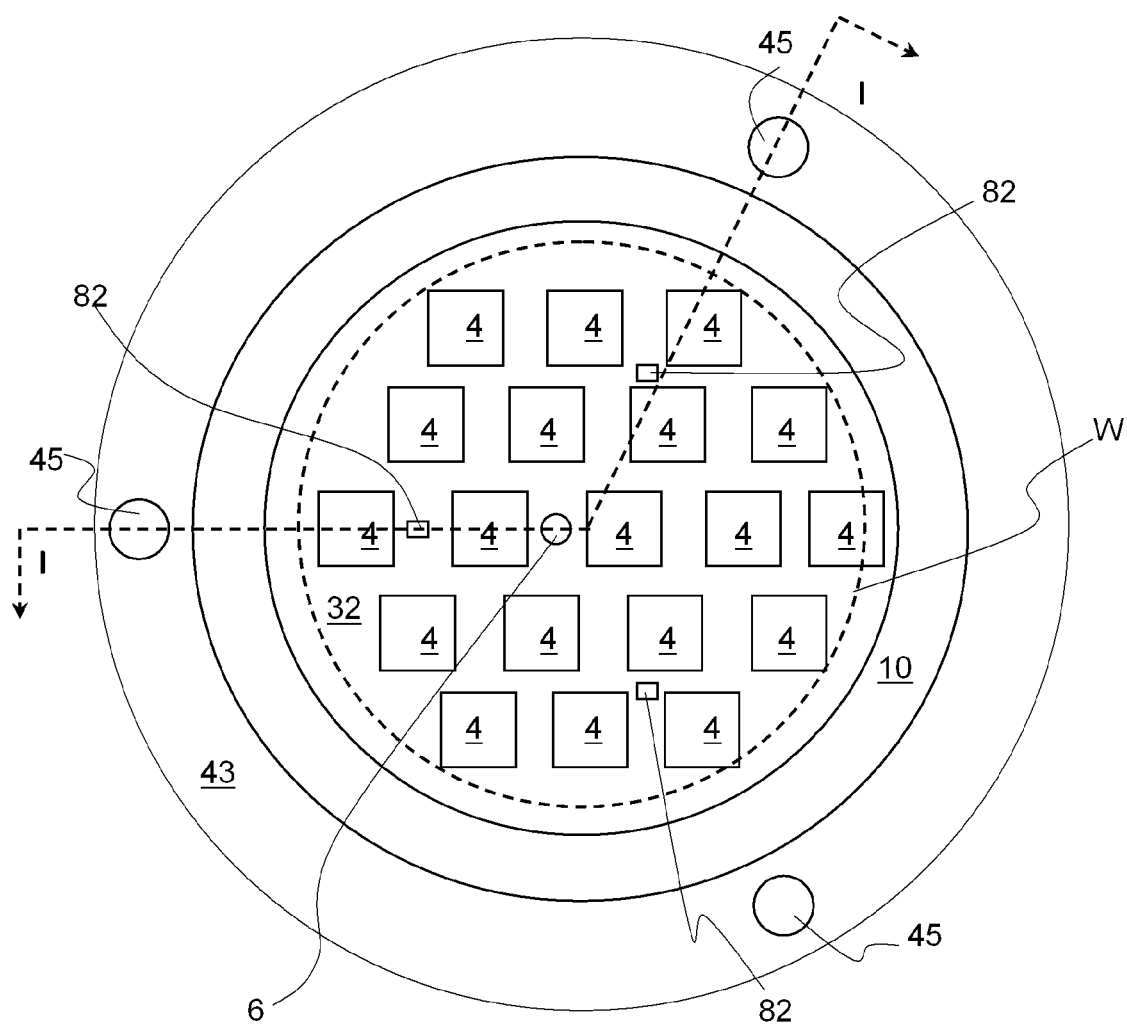

FIG. 1 cross-sectional side view of an embodiment of an apparatus according to the invention (I-I in FIG. 2)

FIG. 2 cross-sectional side view of an embodiment of an apparatus according to the invention (II-II in FIG. 1)

Figure 3:
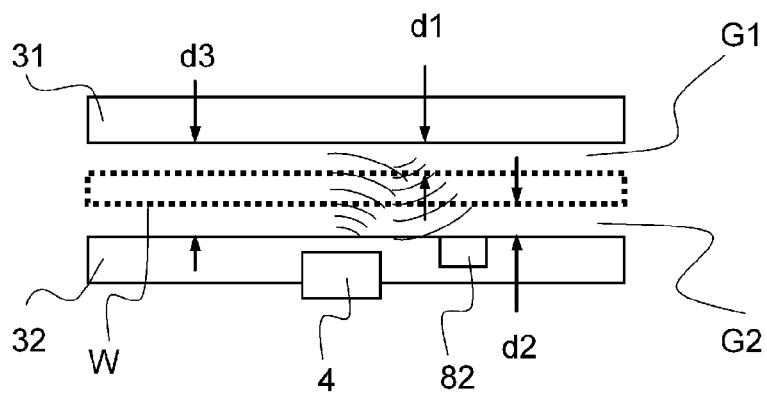

FIG. 3 detailed view of section III in FIG. 1

FIGS. 4-7 detailed view based on FIG. 3 showing alternative arrangements of cleaning transducers, signal sending transducers, and detecting transducers.

Figure 8:
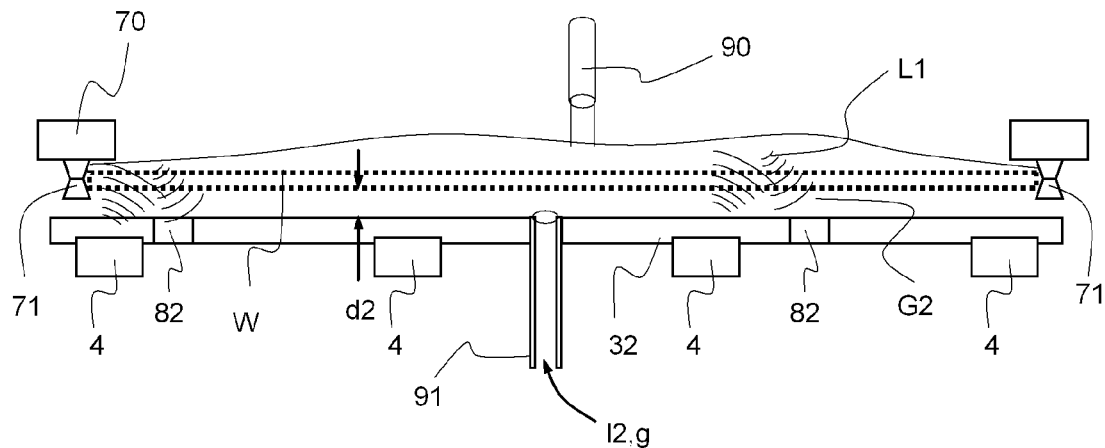

FIG. 8 cross-sectional side view of an alternative embodiment wherein liquid is dispensed on the wafer in a free flow.

Figure 9:
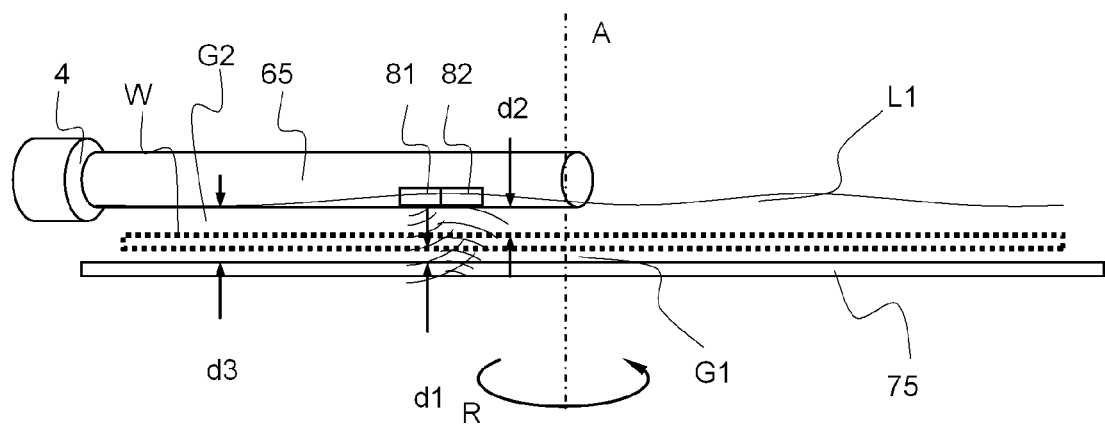
Figure 10:
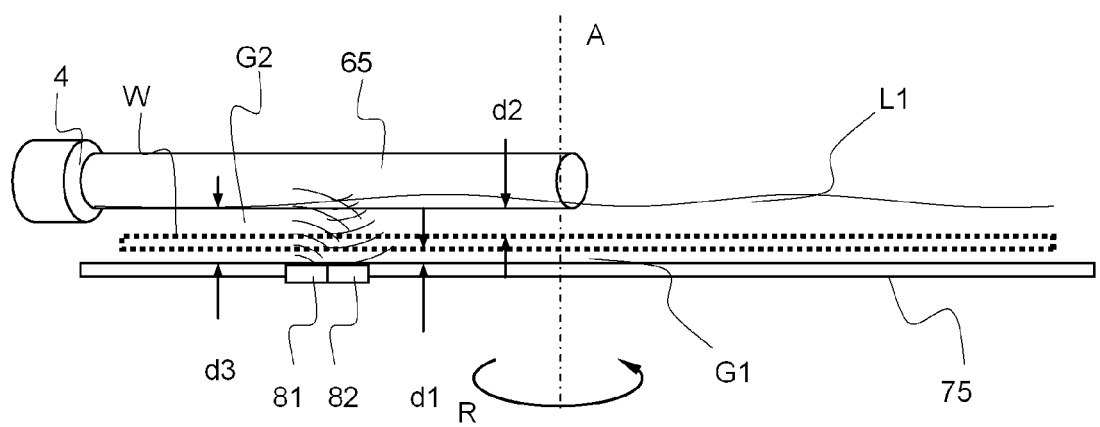
Figure 11:
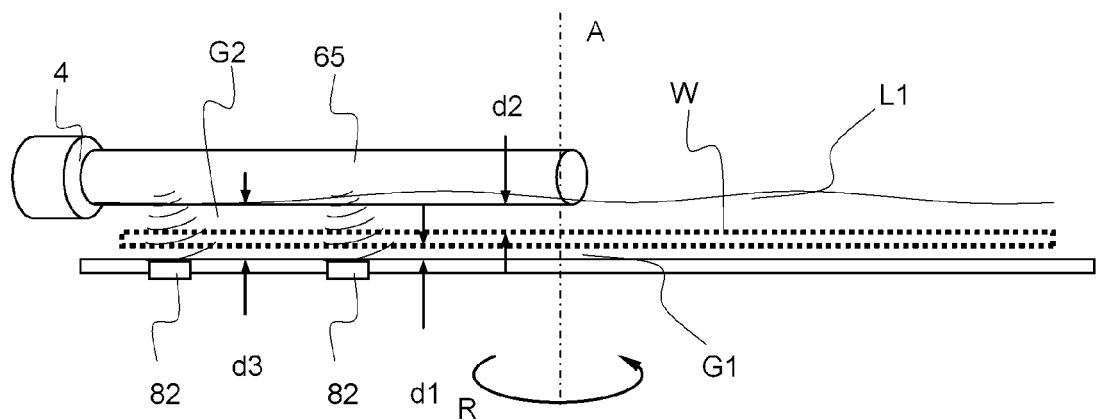

FIGS. 9-11 cross-sectional side view of an alternative embodiment wherein the solid element supplying the ultrasonic sound to the wafer is a shaft.

BEST MODE FOR CARRYING OUT THE INVENTION

FIG. 1, FIG. 2 and FIG. 3 show a wet treatment apparatus 1 according to the present invention. On a horizontal mounting plate 41 with a central opening 42 a hollow shaft motor 8 with a vertical rotation axis A is mounted. The hollow shaft motor comprises a stator 8$s$, a rotor 8$r$ and a hollow rotating shaft 23 fixed to said rotor 8$r$.

The lower end of the hollow shaft 23 projects through the central opening of the first mounting plate 41 and is connected to a first plate 31 perpendicular to said hollow shaft 23. Said first plate 31 has the shape of a circular disk and the central axis A of the hollow shaft 23 goes through the centre of the plate 31. The first plate 31 is part of a gripping device (spin chuck), which further comprises eccentrically movable gripping pins 35. Such pins 35 are eccentrically moved through a tooth gear (not shown) e.g. as described in U.S. Pat. No. 4,903,717. Alternative pin movement mechanisms are disclosed e.g. in U.S. Pat. No. 5,788,453 or U.S. Pat. No. 5,156,174. The shown embodiment comprises six pins. Alternatively only three pins can be used, of which only one pin is eccentrically movable for securely chucking the wafer. If other gripping (clamping) elements are used the number can be reduced to two with one moving element. The first plate 31 is facing downward thus the pins 35 are projecting downwardly for holding the wafer W underneath the first plate 31. If the pins can be opened during rotating the gripping device (e.g. the tooth gear is agitated through a servo motor or each pin through a magnetic switch) the wafer is allowed to freely float between two fluid cushions.

A second plate 32 is provided below and substantially parallel to said first plate 31. The second plate 32 has the shape of a circular disk and the central axis A of the hollow shaft 23 goes through the centre of the second plate 32. Said second plate 32 is circumferentially surrounded by an annular liquid collector 10, which may also be called cup, bowl, or splashguard respectively. The second plate 32 is sealed against the liquid collector with an O-ring seal (not shown) or the second plate 32 is part of the liquid collector. The liquid collector comprises an annular duct 14 for collecting liquid, which is flung of the wafer during wet treatment and the liquid is drained through an opening (not shown) near the bottom of the annular duct 14. The liquid collector further comprises an annular gas suction nozzle 12 directed inwardly above the annular duct 14 for receiving ambient gas and mist deriving from wet treatment. The inner diameter of the upper part of the liquid collector 10 is only somewhat larger than the outer diameter of the first plate 31 so that the first plate can be inserted into the liquid collector leaving a circumferential gap of 0.1-5.0 mm. The gap shall be small enough to seal the wafer against the ambient during treatment but big enough to avoid friction between the first plate 31 and the liquid collector 10 during the first plate being rotated.

The liquid collector 10 is connected to a second mounting plate 43. The second mounting plate 43 is connected to the first mounting plate 41 via lifting means 45. The lifting means are for altering vertical position of the two mounting plates 41 and 43 towards each other. If the second mounting plate 43 is connected to the machine frame (not shown) the lifting means 45 are able to lift and lower the first mounting plate 41 together with the spin chuck comprising the gripping means 35 and the first plate 31. If the first mounting plate 41 is connected to the machine frame the lifting means 45 are able to lift and lower the second mounting plate 43 together with the liquid collector 10 and the second plate 32. The vertical movement is indicated by arrow Z.

There are three lifting means 45 provided so that the distance d2 between the wafer W (plate-like article) and the second plate 32 can be changed at three different points. Given that the wafer W and the second plate 32 are both sufficiently flat the distance d2 can be changed in order to have the distance d2 at all points within the desired range. Consequently the three lifting means 45 can be driven separately. In the shown embodiment each of the lifting means 45 has two different functions. The first function is for lifting the wafer from the transducer plate 32 in order place the wafer into and to pick the wafer from the apparatus. For this first function the lifting means shall be capable of changing the distance between the wafer and the transducer plate by at least 2 cm. The second function of the lifting means is to adjust the distance of the wafer to the transducer plate in order to have the distance d2 at all points within the desired range. For this second function the lifting means shall be capable to adjust the distance with an accuracy of at least +/−0.1 mm. Preferably the accuracy is at least +/−0.01 mm. Appropriate drives for such lifting means are linear motors, spindles with stepper motors, pneumatic lifts or a combination of such drives.

A plurality of ultrasonic vibrating elements 4 (cleaning transducers) are attached to the second plate 32 in a cavity in the plate 32 on the side being opposite to the first plate 31 thus being acoustically coupled to the second plate 32. The vibrating elements 4 are arranged in a way to substantially totally cover the whole diameter of the part of the second plate 32 which covers the wafer during wet treatment or vibrating elements 4 are spread all over the second plate. The vibrating elements 4 are typically piezoelectric transducers.

Additionally three detector transducers 82 are attached to the second plate. Each detector transducer corresponds to a lifting means 45. The signal detected by the detector transducer is used for calculating the distance between the wafer and the second plate. It is feed into a controller (computer) for separately controlling the lifting means.

The distance measuring signal is provided by the transducer 4. It is a pulsed signal overlaying the actual treatment signal. Alternatively this distance measuring signal can be send before the ultrasonic cleaning process is started so that the distance d2 is already within the desired range at all points before the ultrasonic cleaning starts. Thus damages to the structures on the wafer can be prevented and maximum particle-removal-efficiency can be reproducibly achieved.

Eccentrically to the rotational axis A, about which the first plate 31 is rotatable, a lower dispenser 6 is attached to second plate 32 and opens to the room between first and second plate 31, 32. The lower dispenser 6 is configured to dispense either liquid or gas towards the lower side of a wafer W to fully fill the gap G2 between the second plate and the wafer W, this couples the ultrasonic waves generated by vibrating elements 4 to the wafer W. The opening of the lower dispenser 6 is set off the rotational axis A to enable a vibrating element being arranged in close proximity to the wafers centre. Thus all areas of the wafer may be reached by ultrasonic waves. The lower dispenser 6 is connected to a multi port valve (not shown), which is further connected to at least one liquid source and to at least one gas source. Therefore different liquids (cleaning agents) and different gases (e.g. nitrogen) may be selectively applied. The multi port valve may be a cascade of single solenoid valves.

The upper dispense system comprises two coaxially arranged tubes 21 and 22 leading through the hollow shaft 23 attached to first plate 31 and opening to the room between first and second plate 31, 32. The inner tube 21 is for dispensing liquid and the space between inner tube 21 and outer tube 22 is for dispensing gas. Both tubes 21, 22 are rotatable together with the hollow shaft 23. To introduce liquid to the inner tube 21 a liquid rotary connection 5 is provided. Gas is feed in the space between the tubes 21 and 22 through a gas rotary connection 7.

As can be seen in FIG. 3 (detail view III of FIG. 1) the transducer 4 used for cleaning the wafer is also the ultrasonic signal emitting element and transducer 82 is the ultrasonic signal detecting element. The detecting transducer 82 detects the echo reflected from each boundary layer. Consequently not only the distance d2 of the second gap G2 between the transducer plate (solid element, second plate) 32 and the wafer W can be measured but also the distance d1 of the first gap between second plate 31 and the wafer W. This system can either be used for testing the apparatus when the wafer is present or absent or can be used for monitoring and controlling the process.

In an alternative mode the detecting transducers 82 are also used as signal emitting transducers.

MODE(S) FOR CARRYING OUT THE INVENTION

Based on detail view III in FIG. 3 alternative modes of carrying out the invention are disclosed in FIGS. 4-7.

Figure 4:
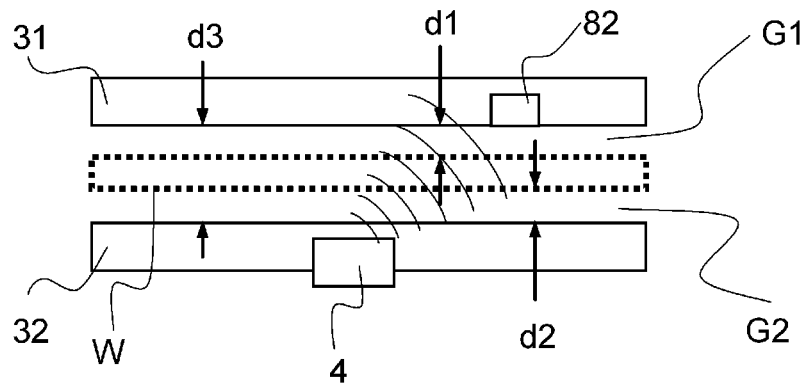

FIG. 4 shows a system wherein the detecting transducer is mounted in the first plate 31, which is opposite the second plate 32 comprising the cleaning transducers 4. Therefore detector 82 detects an ultrasonic signal, which is transmitted through the gap G2, the wafer W and the gap 1. The signal is diffracted depending on the impedances of the different materials (first plate 31, second plate 32, liquid in first gap G1, liquid in second gap G2 and plate-like article W). The system can also be used for testing the apparatus when the wafer W is not present.

Figure 5:
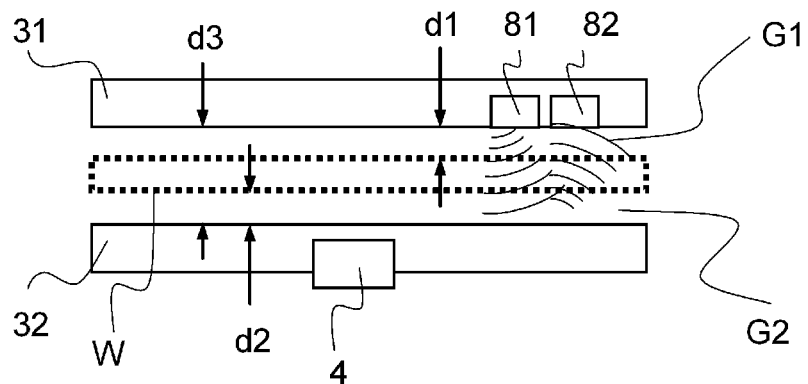

FIG. 5 shows a system wherein a separate transducer 81 for sending the measuring signal (e.g. a pulsed signal) is used. Both the sending transducer 81 and the detecting transducer 82 are element of the first plate 31 opposite the cleaning transducer plate (second plate 32). The detecting transducer is simultaneously used for detecting the echo from the ultrasonic waves emitted by signal transducer 81 and for monitoring the ultrasonic waves emitted by cleaning transducers 4.

Figure 6:
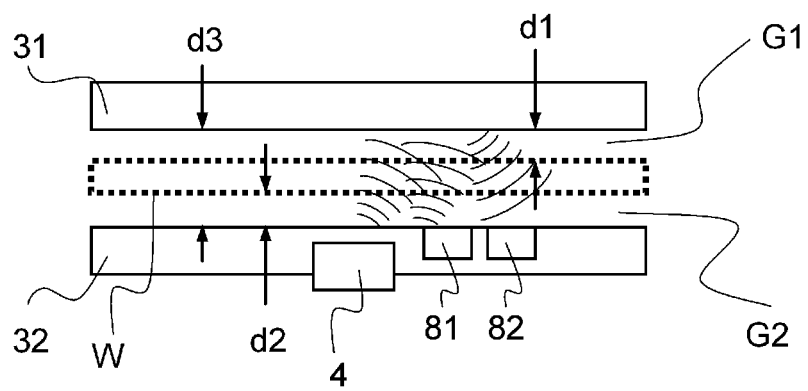

Alternatively both the sending transducer 81 and the detecting transducer 82 can be element of the second plate 32 (transducer plate) as shown in FIG. 6. This configuration can also be used if there is no first plate used (similar to the embodiment as shown in FIG. 8).

Figure 7:
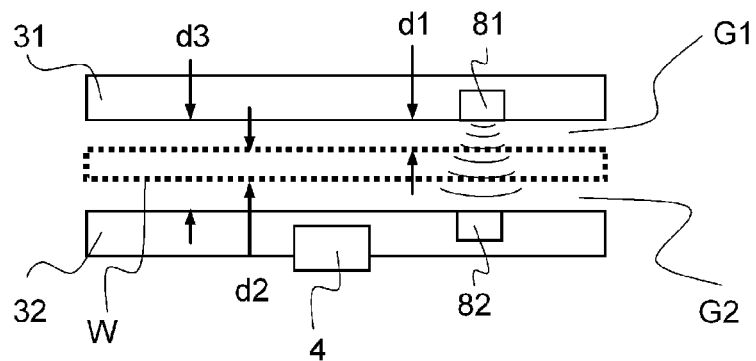

FIG. 7 shows a system where the signal emitting transducer is element of the first plate 31 and detecting transducer 82 is element of the transducer plate 32.

FIG. 8 shows a system where the wafer W is held by gripping pins 71 which are mounted to a ring 70. The ring 70 is a rotating inner part (rotor) of a hollow shaft motor (not shown), by which the wafer can be rotated. Therefore liquid can be dispensed unobstructed by dispense nozzle 90. Thereby a liquid meniscus L1 is formed on the upper side of the wafer W. Below the wafer W a transducer plate 32 is placed in close proximity (0.5-15 mm) to the wafer W. A plurality of transducers 4 are acoustically coupled to the transducer plate 32. The transducer plate 32 is connected to the stator of the hollow shaft motor by lifting means (not shown). Thereby the distance d2 between the wafer W and the transducer plate 32 can be changed and adjusted. Three ultrasonic detectors 82 are acoustically coupled to the transducer plate. The gap G2 is filled with liquid I2 through dispenser 91. After the cleaning process the gap G2 is cleared from liquid by directly displacing the liquid with gas g through the same dispenser 91.

The detectors 82 can detect ultrasonic signal emitted by transducers 4. The detectors can monitor the activity of the transducers and/or detect the echo of a pulsed ultrasonic signal emitted by transducers 4. Thus this signal can be used for measuring the distance d2, which can further be used for controlling the distance d2.

For the modes as shown in FIG. 4 or FIG. 7 when the signal emitting transducer 4 or 81 is opposite the signal detecting transducer 82 it has to be taken into consideration that emitting and detecting transducer may move against each other when the first plate 31 and the second plate 32 rotate against each other. Good measurement conditions can be achieved if emitting transducer and detecting transducer stand very close to each other—not more than 2 cm apart from each other.

FIG. 9 discloses an ultrasonic cleaning apparatus according to another mode of the invention based on the apparatus shown in U.S. Pat. No. 5,365,960. The wafer W can be mounted on a spin chuck with a chuck plate 75 facing the wafer. The spin chuck can be a vacuum chuck, an edge contact only gripping chuck, or a so called Bernoulli-chuck. Alternatively the wafer can be floated and rotated on a cushion of liquid or gas. Liquid is dispensed onto the wafer and thereby forming a liquid meniscus L1. A rod-like probe (solid element) 65 is brought in close proximity and parallel to the wafer surface so that it partly immerses into the liquid meniscus. The rod-like probe is acoustically coupled to an ultrasonic transducer 4. A second liquid may be dispensed into the gap G2 between the wafer and the chuck plate 75 by a central liquid dispenser (not shown; similar to liquid dispenser 91 in FIG. 8).

An ultrasonic measuring signal emitting transducer 81 and an ultrasonic measuring signal detecting transducer 82 are element of the rod-like probe and facing the wafer W. The wires for the power supply to signal emitting transducer 81 as well as for the detected signal coming from the detecting transducer 82 are lead through the rod-like probe. Both transducers 81 and 82 are pressed into cavities of the rod-like probe. Provided that the probe (solid element) is sufficiently parallel to the wafer only on transducer assembly 81, 82 for measuring the distance d2 between the solid element and the wafer is needed. If also the parallelism shall be corrected a second transducer assembly 81, 82 is useful.

FIG. 10 shows an alternative mode based on the mode shown in FIG. 9, wherein both the signal emitting transducer 81 as well as the detecting transducer 82 are located in the chuck plate 75. A second liquid is dispensed into the gap G2 between the wafer and the chuck plate 75 by a central liquid dispenser (not shown; similar to liquid dispenser 91 in FIG. 8). As the chuck plate is rotatable the distance to the rod-like probe can only if the transducer assembly 81, 82 is located underneath the rod-like probe. The measurement can be carried out before the cleaning process is started or if the chuck plate 75 rotates once a revolution when the transducer assembly passes the rod-like probe.

FIG. 11 shows an alternative mode based on the mode shown in FIG. 10, wherein for the signal emitting transducer the cleaning transducer 4 is used and a plurality of detecting transducers 82 (this sectional view shows two detecting transducers 82) are located in the chuck plate 75. Measurement is carried out when the rod-like probe is in close proximity to the detecting transducer 82. The measuring signal comes from the cleaning transducer 4 and is emitted by the rod-like probe 65.

The invention claimed is:

1. An apparatus for ultrasonic wet treatment of a plate-like article, comprising:
    a solid element connected to a transducer for treating the plate-like article with ultrasonic energy wherein a gap is formed between the solid element and the plate-like article, the gap having a distance d2 between 0.1 mm and 15 mm, the gap being configured to be changed and adjusted during the treatment;
    liquid dispensing means for introducing liquid into the gap between the solid element and the plate-like article when being treated; and
    an ultrasonic detector configured for measuring ultrasonic waves, the ultrasonic detector being an ultrasonic transducer.

2. The apparatus according to claim 1 wherein the ultrasonic detector is simultaneously the transducer for ultrasonic wet treatment of the plate-like article.

3. The apparatus according to claim 1 wherein the ultrasonic detector is not the same transducer as for wet treatment of the plate-like article.

4. The apparatus according to claim 1 wherein the ultrasonic detector is simultaneously the ultrasonic transducer for ultrasonic wet treatment of the plate-like article.

5. The apparatus according to claim 1 wherein the ultrasonic detector is simultaneously the transducer for wet treatment of the plate-like article.

6. The apparatus according to claim 1 wherein the ultrasonic detector is part of an ultrasonic distance measuring system.

7. The apparatus according to claim 1 wherein the ultrasonic detector is part of an ultrasonic imaging system.

8. The apparatus according to claim 1 wherein the ultrasonic detector is part of an ultrasonic power monitoring system.

9. The apparatus according to claim 1, further comprising:
    means for controlling the distance d2, the means for controlling the distance comprising means for measuring the distance d2, means for comparing the measured distance with a desired distance d0 and distance adjusting means for adjusting the distance accordingly.

10. The apparatus according to claim 9 wherein the means for measuring the distance d2 comprise optical measuring elements.

11. The apparatus according to claim 9 wherein the means for measuring the distance d2 comprise ultrasonic measuring elements comprising at least one of an ultrasonic transducer for sending the distance measuring signal or an ultrasonic detector for detecting the distance measuring signal.

12. The apparatus according to claim 11 wherein the ultrasonic transducer for measuring the distance is simultaneously the transducer for wet treatment of the plate-like article.

13. The apparatus according to claim 11 wherein the ultrasonic transducer for measuring the distance is not the same transducer as for wet treatment of the plate-like article.

14. The apparatus according to claim 11 wherein the ultrasonic detector for measuring the distance is simultaneously the ultrasonic transducer for sending the distance measuring signal.

15. The apparatus according to claim 11 wherein the ultrasonic detector for measuring the distance is simultaneously the transducer for wet treatment of the plate-like article.

16. The apparatus according to claim 11 wherein at least three ultrasonic transducers for measuring the distance are provided.

17. An apparatus for ultrasonic wet treatment of a plate-like article, comprising:
- a solid element connected to a transducer for treating the plate-like article with ultrasonic energy wherein a gap is formed between the solid element and the plate-like article, the gap having a distance d2 between 0.1 mm and 15 mm, the gap being configured to be changed and adjusted during the treatment;
- liquid dispensing means for introducing liquid into the gap between the solid element and the plate-like article when being treated;
- an ultrasonic detector configured for measuring ultrasonic waves, the ultrasonic detector being an ultrasonic transducer; and
- means for controlling the distance d2, the means for controlling the distance comprising means for measuring the distance d2, means for comparing the measured distance with a desired distance d0 and distance adjusting means for adjusting the distance accordingly.

18. The apparatus according to claim 17 wherein the means for measuring the distance d2 comprise optical measuring elements.

19. The apparatus according to claim 17 wherein the means for measuring the distance d2 comprise ultrasonic measuring elements comprising at least one of an ultrasonic transducer for sending the distance measuring signal or an ultrasonic detector for detecting the distance measuring signal.

20. The apparatus according to claim 19 wherein the ultrasonic transducer for measuring the distance is simultaneously the transducer for wet treatment of the plate-like article.

* * * * *

UNITED STATES PATENT AND TRADEMARK OFFICE
CERTIFICATE OF CORRECTION

PATENT NO.       : 8,573,236 B2                                     Page 1 of 1
APPLICATION NO.  : 12/600351
DATED            : November 5, 2013
INVENTOR(S)      : Obweger et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 695 days.

Signed and Sealed this
Twenty-second Day of September, 2015

Michelle K. Lee
*Director of the United States Patent and Trademark Office*